United States Patent [19]

Liu

[11] Patent Number: 4,709,467

[45] Date of Patent: Dec. 1, 1987

[54] NON-SELECTIVE IMPLANTATION PROCESS FOR FORMING CONTACT REGIONS IN INTEGRATED CIRCUITS

[75] Inventor: Yow-Juang (Bill) Liu, San Jose, Calif.

[73] Assignee: Advanced Micro Devices, Inc., Sunnyvale, Calif.

[21] Appl. No.: 839,756

[22] Filed: Mar. 13, 1986

[51] Int. Cl.$^4$ .................. H01L 21/265; H01L 21/28
[52] U.S. Cl. .................................. 437/30; 357/42; 437/34; 437/175
[58] Field of Search ............... 29/571, 576 B; 148/1.5, 148/187; 357/42

[56] References Cited

U.S. PATENT DOCUMENTS

| | | | |
|---|---|---|---|
| 4,404,733 | 9/1983 | Sasaki | 29/576 B |
| 4,541,166 | 9/1985 | Yamazaki | 29/571 |
| 4,549,914 | 10/1985 | Oh | 148/187 |
| 4,553,315 | 11/1985 | McCarty | 29/576 B |
| 4,575,920 | 3/1986 | Tsunashima | 29/571 |

OTHER PUBLICATIONS

Yamaguchi et al, IEEE Trans. Electron Devices, ED 32 (1985) 184.

Primary Examiner—Upendra Roy
Attorney, Agent, or Firm—Patrick T. King; Eugene H. Valet

[57] ABSTRACT

An integrated circuit fabrication technique for a maskless method of forming contact regions in integrated circuits is disclosed. By carefully controlling implant dosages, ions of one conductivity type can be introduced into substrate regions having the same conductivity type to form enhanced characteristic contact regions without affecting the operational characteristics of substrate regions having the opposite conductivity type. The resulting cross-sectional profile of the regions of the one conductivity type allows fabrication overlap tolerances to be reduced and improves the contact regions' imperviousness to the spiking phenomenon.

7 Claims, 24 Drawing Figures

NON-SELECTIVE IMPLANTATION PROCESS FOR FORMING CONTACT REGIONS IN INTEGRATED CIRCUITS

BACKGROUND OF THE INVENTION

1. Field of the Invention

The present invention generally relates to integrated circuit fabrication techniques and, particularly, to a maskless process for forming contact regions in an integrated circuit substrate, particularly useful for high density, complementary metal-oxide-semiconductor (CMOS) circuits.

2. Description of the Related Art

Very large scale integration (VLSI) in integrated circuit technology has resulted in semiconductor chips in which the geometry of individual components is continuously scaled downward in order to provide more complex integrated circuits, to improve performance, and to conserve chip area for better manufacturing yield, using substantially the same die sizes. The basic objective in scaling is to preserve the original device characteristics in miniaturized geometry.

In order to create the complex, three-dimensional structure of an integrated circuit, the execution of a large number of individual and complex interactive operations is required. The photolithographic fabrication process requires repeated transfers of an image from a photosensitive mask, "photoresist," to a semiconductor wafer. If the device is to operate in accordance with the circuit design, it is critical that each layer be correctly aligned with previously formed layers. The larger the number of layers and interconnections the more masks used, and the more critical the alignment factor.

Fabrication technology commonly is referred to in terms relating to aspects of the dimensions of certain regions of a particular circuit. For example, in circuits which use field effect transistors (FET) having a "channel region," the process used to fabricate the chip often is referred to by the channel length, i.e. "a 1.5 micron process" or a "submicron process." As dimensions shrink, photolithographic techniques encounter significant problems. Primary problems in getting submicron resolution with optical-imaging equipment are standing-wave patterns generated in the photoresist, the change in focus of projected images, and the light scattering and lateral exposure that causes changes in the width of individual regions of the structure.

For each individual level, the minimum line width of a feature and the minimum separation between these features on a fully processed wafer is defined by the design rules. These dimensions are a function of the minimum dimensions on a mask that can be resolved in the lithography and the change that the feature undergoes during the specific steps in the process that define and follow the definition of the feature. For example, a local oxidation process to form an insulating field oxide region causes the space between active regions to change. Hence, the final separation between these features in a silicon substrate will be different from that on the mask. As another example, lateral diffusion of impurities due to temperature changes and the lateral extent of the junction depletion layers under applied voltages also govern the minimum separation between devices on a given level. The design rules governing the minimum separation between features must take these types of effects into account.

An important alignment factor of the design rules is commonly referred to as "overlay tolerance" or "overlap." Overlap is again a function of the lithographic tool and its alignment accuracy. A typical alignment accuracy of current lithographic stepper machines is, for practical purposes, about 0.7 micron. The design rules must include a tolerance for misalignment of features in order to overcome the limitations of the lithographic process to insure, for example, that an interconnect layer actually contacts the proper subjacent transistor regions in accordance with the circuit design.

Figure 1:
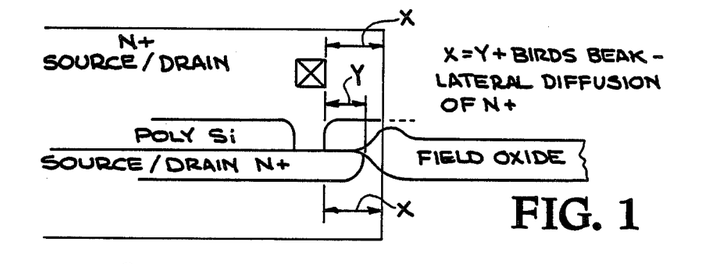
FIG. 1 is a schematic drawing of a plan view (top) and a cross-sectional view overlay of a portion of a typical integrated circuit demonstrating an "overlap tolerance" design specification.

FIG. 1 depicts a tolerance region of particular concern, viz., the alignment of a contact window to an active region of the semiconductor substrate; e.g., a FET source/drain region adjacent to a field oxide, (shown in overlaying different planar aspects). The overlap tolerance is defined as "x" where "y" is the effective overlap dimension which determines contact breakdown voltage. As device density increases, the accurate alignment of contact windows becomes more critical to the layout and, at the same time, more difficult.

SUMMARY OF THE INVENTION

It is an object of the present invention to provide a method for scaling contact regions of an integrated circuit.

It is another object of the present invention to provide an integrated fabrication process which enhances substrate contact regions without requiring any additional masking steps.

It is a further object of the present invention to provide an integrated circuit maskless impurity doping method which does not substantially affect substrate regions having an opposite impurity doping.

It is yet another object of the present invention to provide an integrated circuit fabrication technique which alleviates overlay tolerance constraints.

In a broad aspect, the present invention is an improvement in a process for fabricating an integrated circuit in a substrate, wherein process steps of forming discrete active regions of first and second conductivity types in said substrate have been completed and electrical contacts and interconnections to said active regions are yet to be completed. A method is disclosed for forming improved contact regions in said active regions of one of said conductivity types characterized by introducing impurities of said one of said conductivity types into said substrate in a dosage which deepens the active region-to-substrate junction of said active regions of said one of said conductivity types substrate without substantially affecting the junction depth and resistivity of said active regions of the other conductivity type.

It is an advantage of the present invention that contact regions within doped regions of the substrate are deepened, allowing overlap tolerances to be reduced.

It is another advantage of the present invention that it is a maskless process, eliminating attendant alignment problems.

It is yet a further advantage of the present invention that it is applicable to processes having a wide range of design rules.

The present invention has an additional advantage in that it forms a structure which improves the ability of a doped region to withstand "spiking" of metal through the doped region and into the substrate during formation of interconnection layers.

Other objects, features and advantages of the present invention will become apparent upon consideration of the following detailed description and the accompanying drawings, in which like reference designations represent like features throughout the FIGURES.

BRIEF DESCRIPTION OF THE DRAWINGS

FIGS. 2(a) through 2(e) are schematic cross-sectional drawings of stages of an idealized integrated circuit fabrication process of the prior art in which:

FIGS. 3(a) through 3(c) are schematic cross-sectional drawings of stages of an idealized integrated circuit fabrication process in accordance with a preferred embodiment of the present invention in which:

The drawings referred to in this description should be understood as not being drawn to scale except if specifically noted. Moreover, the drawings are intended to illustrate only one portion of an integrated circuit fabricated in accordance with the present invention.

DETAILED DESCRIPTION OF THE INVENTION

Reference is made now, in detail, to a specific embodiment of the present invention which illustrates the best mode presently contemplated by the inventor for practicing the invention. Alternative embodiments are also briefly described as applicable.

It should be recognized that many publications describe the details of common techniques used in the fabrication of integrated circuit components. See, e.g., *Semiconductor & Integrated Circuit Fabrication Techniques*, Reston Publishing Co., Inc., copyright 1979 by the Fairchild Corporation; or *VLSI Technology*, McGraw-Hill Book Company, copyright 1983 by Bell Telephone Laboratories, Inc. (S. M. Sze, Editor). Those techniques can be generally employed in the fabrication of the structure of the present invention. Moreover, the individual steps of such a process can be performed using commercially available integrated circuit fabrication machines. As specifically helpful to an understanding of the present invention, approximate technical data are set forth based upon current technology. Future developments in this art may call for appropriate adjustments as would be obvious to one skilled in the art.

Figure 2A:
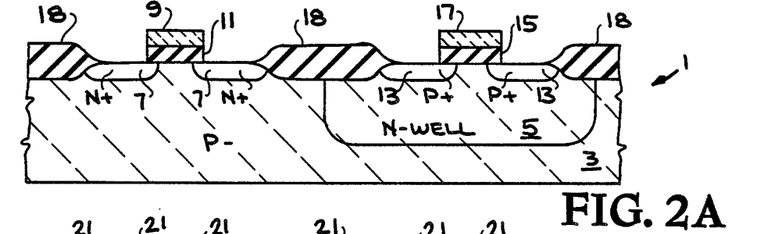
FIG. 2(a) depicts a partial CMOS structure in which n-channel and p-channel FETs have been formed on a substrate.

FIG. 2(a) shows a cross-section of a segment of a CMOS integrated circuit structure 1 in partial completion in accordance with known fabrication technology. A semiconductor substrate, such as of a crystalline silicon wafer, has been lightly doped to give it a p-type conductivity, $p_-$. As will be recognized by one skilled in the art, the doping of the various regions is relative to the technology being employed. Hence, the structure 1 described throughout this description is only one example of structures in which the present invention is useful.

In CMOS, both n-channel and p-channel FETs are employed; therefore, a doped well 5, having a conductivity, n, which is opposite that of the substrate, has been formed wherever p-channel FETs are to be constructed. In the present embodiment, the overlap tolerance of the p-channel contact region to the field oxide is approximately 1.5 microns. An n-channel FET having source/drain regions 7, heavily doped to have an n+conductivity, and a gate 9- such as of polysilicon superposing an insulated portion 11 from a channel region formed by the source/drain regions 7- is shown as formed on the substrate 3. In the present embodiment, the overlap tolerance of the n-channel contact region to the field oxide is approximately 0.75 micron. Conventional process overlap tolerance would be approximately 2.0 microns for both n-channel and p-channel FETs for the same 0.7 micron alignment accuracy and 1.5 micron discrete bird's beak widths as in the present embodiment. A p-channel FET having source/drain regions 13, heavily doped to have a p+conductivity, and a gate 17, having an insulated portion 15, is shown as formed in the n-well 5.

Individual components of the integrated circuit are electrically isolated by oxidized silicon regions 18, commonly referred to as "field oxide" (FOX).

Figure 2B:
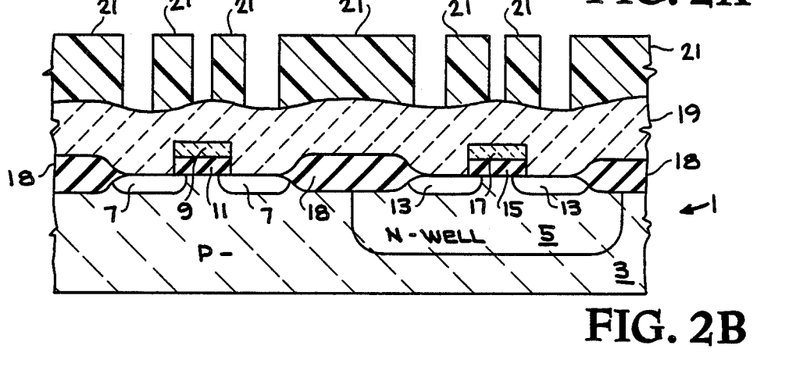
FIG. 2(b) depicts the structure of 2(a) after step completion in which an insulator and superposing photoresist mask have been formed.

Referring now to FIG. 2(b), the structure 1 is shown following the forming of a layer 19 of an insulator material, e.g., boronphosphosilicate glass (BPSG) or phosphorous doped vapor oxide glass (PVX). A patterned mask 21, such as of a photoresist is formed in accordance with the pattern of contact apertures needed to interconnect regions such as the source/drains 7, 13 and gates 9, 17 in order to couple circuit components.

Figure 2C:
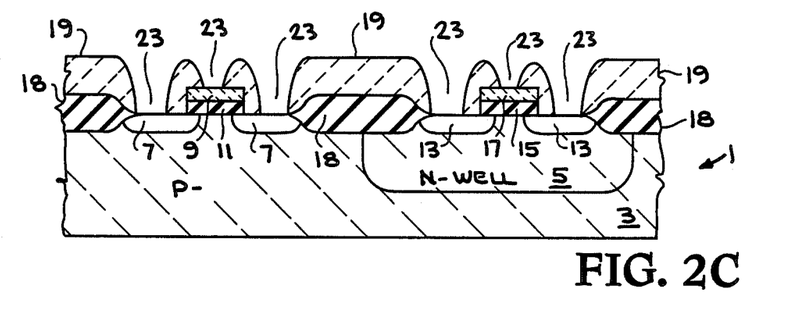
FIG. 2(c) depicts the structure of 2(b) after step completion in which etching has been performed to open contact windows to the active device regions of the substrate.

FIG. 2(c) depicts the structure 1 following the etching of the contact apertures 23.

Figure 2D:
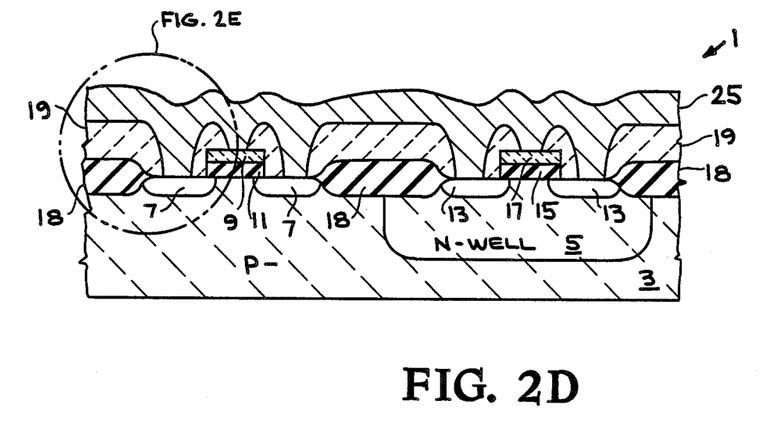
FIG. 2(d) depicts the structure of 2(c) after step completion in which a metal interconnect layer has been formed.
Figure 2E:
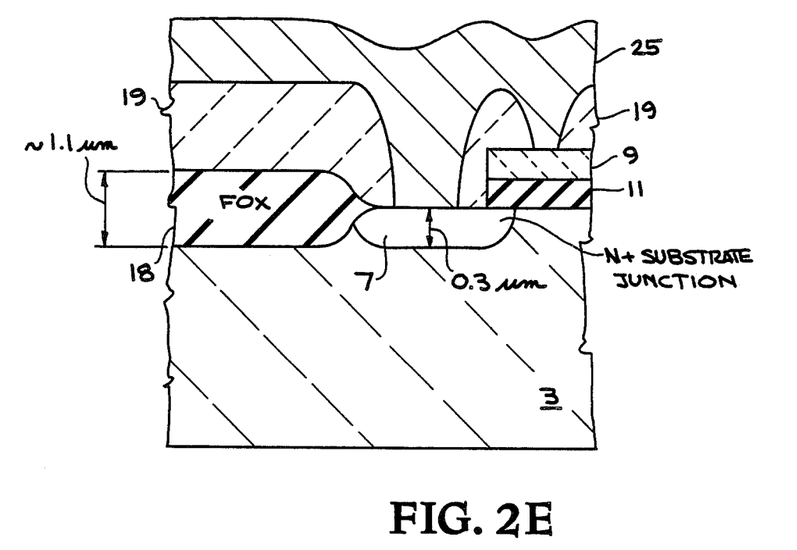
FIG. 2(e) depicts a magnified area of the structure of 2(d) showing a typical profile of the contact region for CMOS structures.

FIG. 2(d) shows the structure 1 following the formation of the metal interconnect layer 25. In order to demonstrate a typical contact to a source/drain 7, the circled area of FIG. 2(d) is shown in a magnified depiction in FIG. 2(e). Typical dimensions for this conventional process are shown. It should be kept in mind that the given dimensions are exemplary and will vary in accordance with the electrical specification design rules for the fabrication of any specific integrated circuit.

Figure 3A:
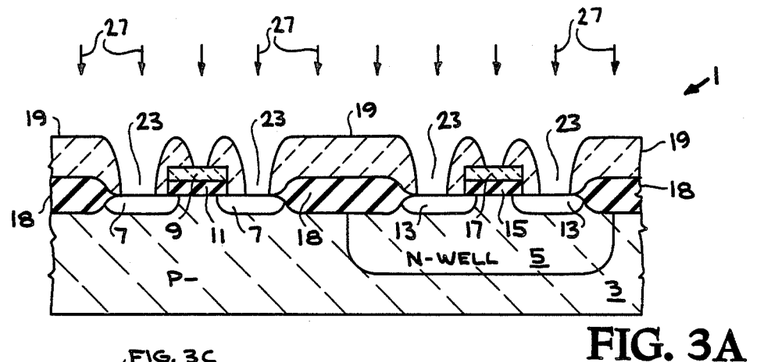
FIG. 3(a) depicts the maskless implant step of the present invention.
Figure 3B:
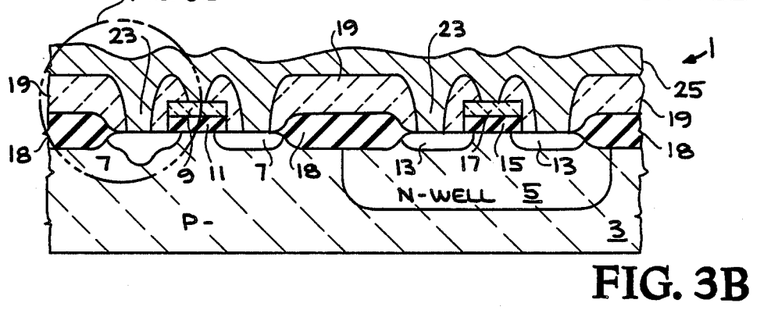
FIG. 3(b) depicts the structure of 3(a) after step completion in which a metal interconnect layer has been formed.
Figure 3C:
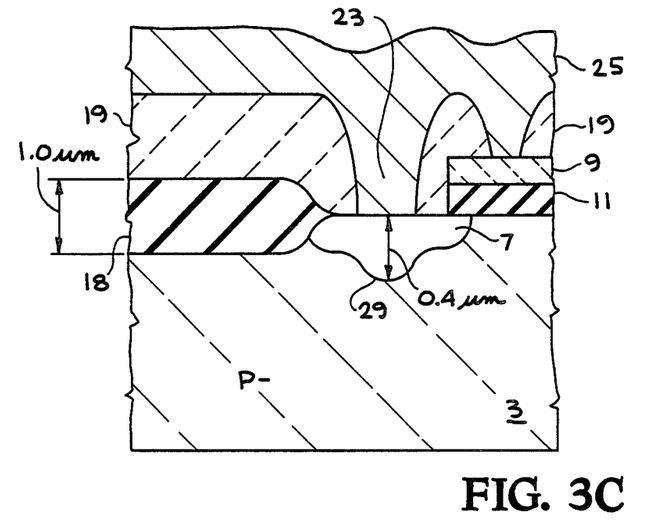
FIG. 3(c) depicts a magnified area of the structure of 3(b) showing a typical enhanced profile of the contact region formed by the method of the present invention.

The present typical invention method is shown in FIGS. 3(a) through 3(c). The fabrication process is performed in accordance with the conventional steps as described with respect to FIGS. 2(a) through 2(c), viz., to where the structure 1 is amenable to formation of the metal interconnection layer 25.

The present invention allows the manufacturer to form a deeper contact area in the source/drain regions 7 of the n-channel FET without requiring any additional masking step. In other words, in known CMOS processes to enhance a substrate contact region, another mask is formed to prevent the introduction of dopants which enhance the n-type source/drain regions from affecting the operational characteristics of other active regions of the substrate 3. Another masking step, of course, adds further complications in alignment and overlap tolerance and is counterproductive to device shrinkage. In NMOS technology, an additional drive-in step would have to be used to deepen the substrate junction. By employing the concept of the present invention, such additional steps are eliminated.

Referring to FIG. 3(a), the method of the present invention is to direct a beam of dopant ions, such as phosphorous (represented by arrows 27) for enhancing contact regions of n-channel FETs, onto the entire structure 1 in a carefully controlled technique which does not affect the operational characteristics of other active regions such as the p-channel FET in n-well 5.

The results of experimentation to determine the correct operating range for performing the method of the present invention is shown in FIG. 6. As a control, a device was fabricated using the conventional process steps with the additional masking step. As shown in FIGS. 6(a) and 6(b), this resulted in devices (each "x" representing a test device) having a junction breakdown voltage, BV, of 30+ volts for the n-channel FET and approximately $-25$ volts for the p-channel FET (which had been masked from receiving any of a phosphorous implant) after a dosage of $1 \times 10^{14}$; overlap tolerances are given.

Figure 6A:
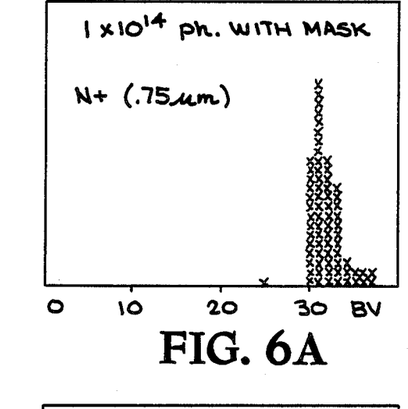
FIGS. 6(a) through 6(l) are a set of graphical representations comparing the effects of a variety of phosphorous ion implant dosages.
Figure 6B:
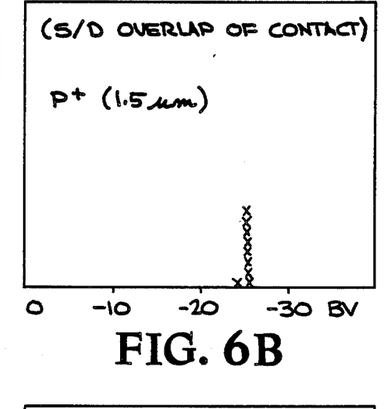
Figure 6C:
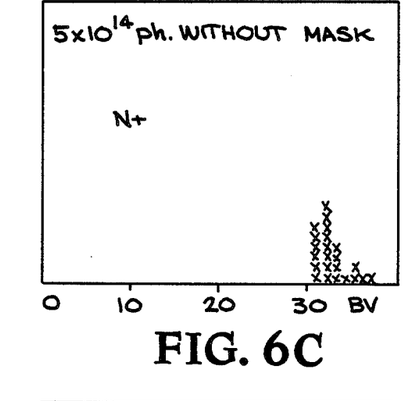
Figure 6D:
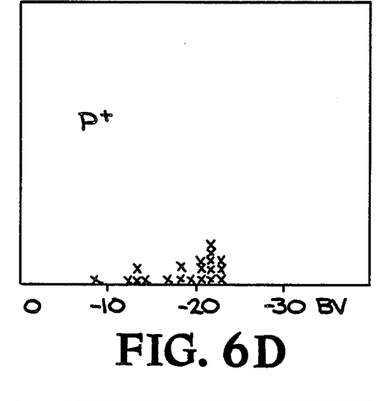
Figure 6E:
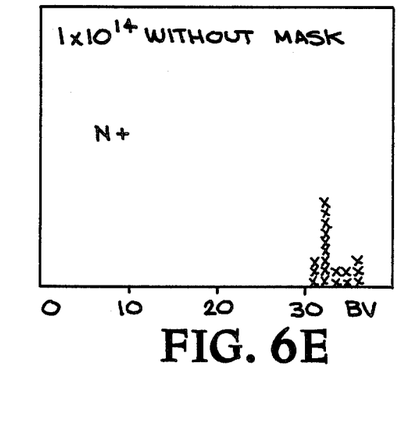
Figure 6F:
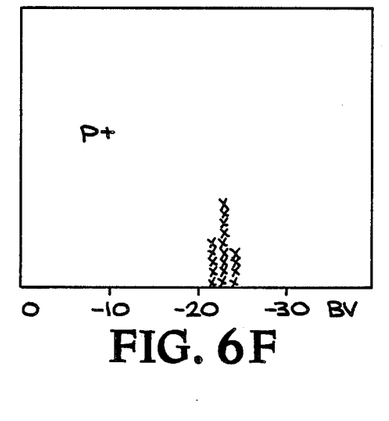
Figure 6G:
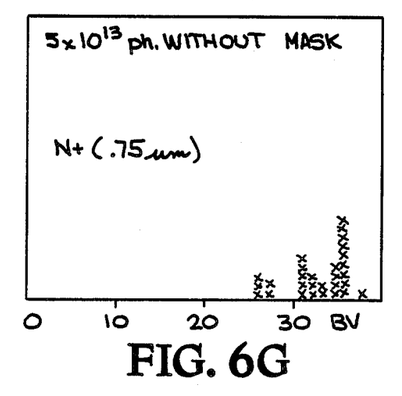
Figure 6H:
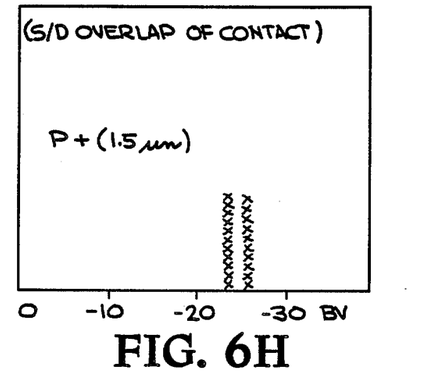
Figure 6I:
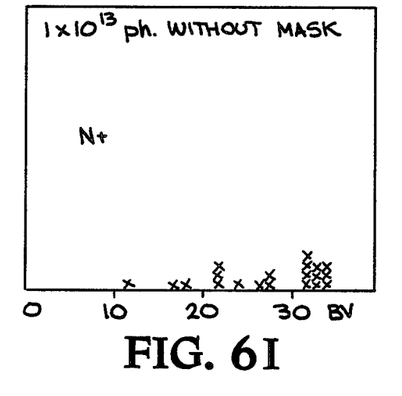
Figure 6J:
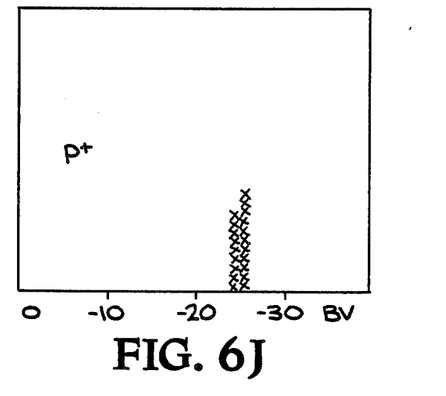
Figure 6K:
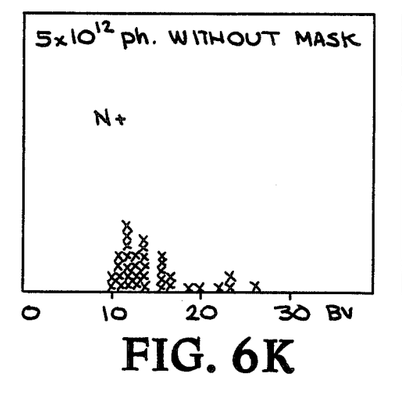
Figure 6L:
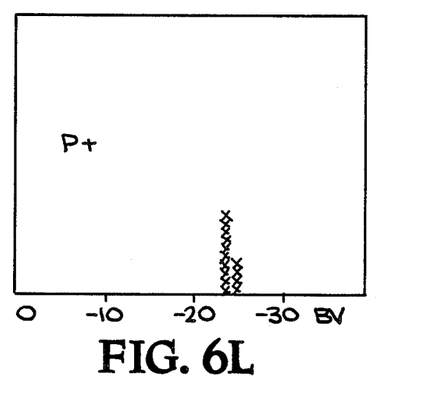

As shown in FIGS. 6(c) and 6(d), a test wafer was subjected to a dosage of $5 \times 10^{14}$ ions without a mask. The n-channel BV was slightly improved at the mode to approximately 33 volts. However, as shown in FIG. 6(d), the p-channel FET BV was severely degraded and unacceptable. By similar analysis, it is apparent from FIG. 6 that only a specific range of implant dosage results in operationally acceptable structures when a maskless implant is performed: in this embodiment the range shown in FIGS. 6(e) through 6(h).

It is important to note that the window of working range will vary depending upon the layer-to-layer alignment accuracy employed in the process; and a 0.7 micron alignment accuracy process is used in this embodiment.

Figure 4:
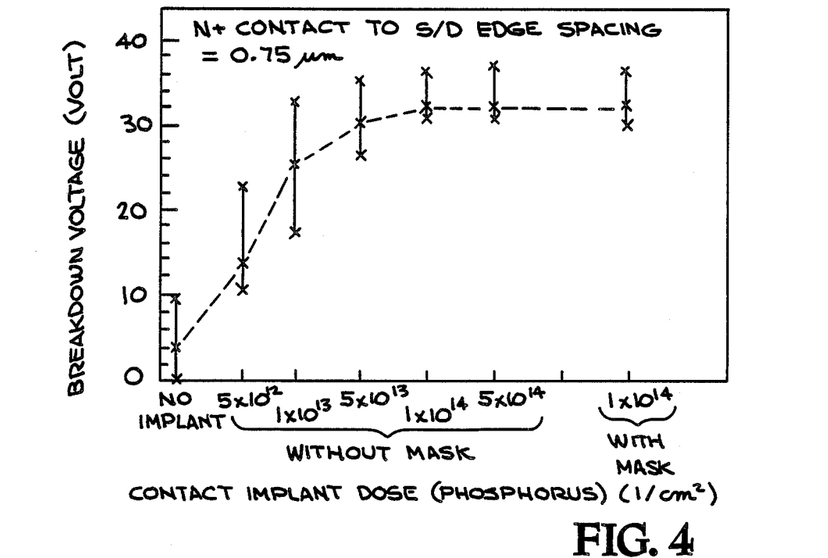
FIG. 4 is a graphical representation of test data comparing device junction breakdown voltage characteristics for various ion implant dosages into n-type conductivity regions having an overlap tolerance specification of 0.75 micron.
Figure 5:
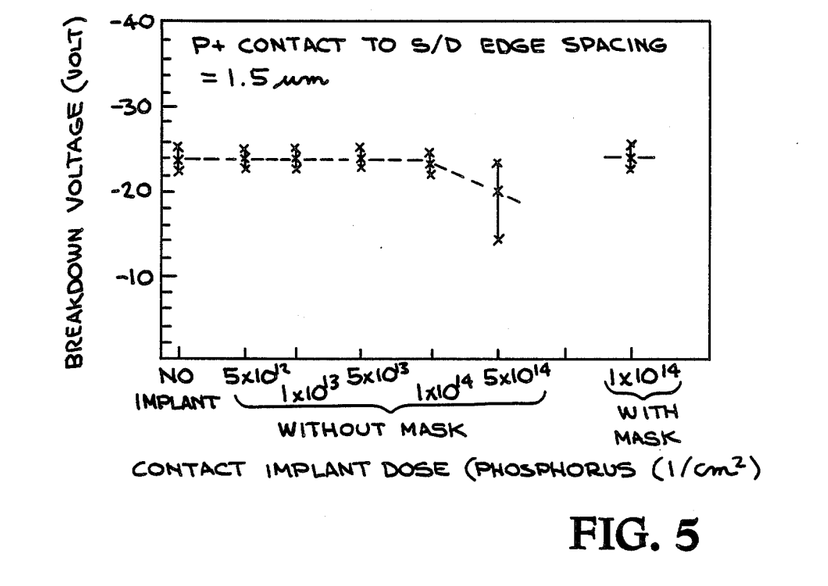
FIG. 5 is a graphical representation of test data comparing device junction breakdown voltage characteristics for various phosphorous ion implant dosages into p-type conductivity regions having an overlap tolerance specification of 1.5 microns.

FIGS. 4 and 5 graphically show the same results on a plot of breakdown voltage vs. implant dosage. Again, this demonstrates that by using the method of the present invention to form an enhanced contact region a masking step can be completely eliminated.

Figure 7:
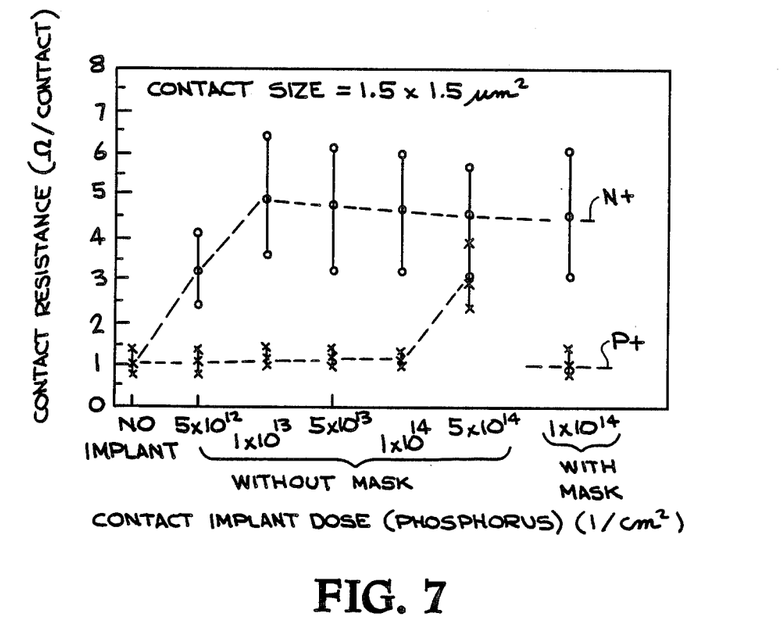
FIG. 7 is a graphical representation showing contact resistance variations in n-type and p-type regions for various phosphorous ion implant dosages.

FIG. 7 presents another way to consider the improvement in the contact region formed in accordance with the present invention. Contact resistance for both the n-channel and p-channel contact regions is plotted against a range of implant dosages.

Referring back to FIG. 3(b), the structure 1 is shown following the formation of the metal interconnect layer 25. The enhanced contact region of the n-channel FET encircled in 3(b) is depicted in magnified form in FIG. 3(c). Assuming the same basic design rules as the conventional process discussed with respect to FIG. 2, it can be seen that the contact region of the n-type doped source/drain region 7 following the maskless implant has a significantly enhanced cross-sectional profile. Specifically, the deepening of the source/drain region 7 directly below the contact aperture 23 indicates that contact masks can have smaller overlap tolerances, and that the probability of metal 25 spiking through the region-to-junction substrate junction 29 is substantially reduced.

It has been found that the maskless contact implant method described can be applied to the 0.7 micron overlap tolerances achievable with the state-of-the-art lithography machines used in integrated circuit manufacture. This allows a scaling of a factor of approximately three compared to conventional, non-enhanced contact regions. With improvements in the lithography registration accuracy, the minimum tolerance can be reduced even further.

The foregoing description of the preferred and alternative embodiments of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other technologies, such as with other MOS or even bipolar processes. Similarly, any process steps described might be interchangeable with other steps in order to achieve the same result. The embodiment was chosen and described in order to best explain the principles of the invention and its practical application to thereby enable others skilled in the art to understand the invention for various embodiments and with various modifications as are suited to the particular use contemplated. It is intended that the scope of the invention be defined by the claims appended hereto and their equivalents.

What is claimed is:

1. In a process for fabricating an integrated circuit in a substrate containing both PMOS and NMOS devices, wherein process steps have been completed for forming in said substrate n-doped source and drain regions and p-doped source and drain regions, wherein the source and drain regions of one of said conductivity types is shallower than the source and drain regions of the opposite conductivity type, and wherein the process steps for forming electrical contacts to said source and drain regions have been completed up to the opening of contacts to said regions through an overlying insulating layer, a method for deepening the shallower source and drain regions of said one conductivity type to inhibit spiking of a subsequently formed metal contact thereon through said regions which comprises:

introducing impurities of said one conductivity type into said substrate through said contact openings in said insulation layer in a dosage having a range sufficiently high to deepen said shallow source and drain regions of said one conductivity type yet not high enough to lower the breakdown voltage of the source and drain regions of said opposite conductivity type, whereby spiking from a subsequently formed metal contact through said initially shallow source and drain regions is inhibited without lowering the breakdown voltage of said source and drain regions of the opposite conductivity type without the need for masking the source and drain regions of said opposite conductivity type during said introduction of impurities.

2. The method as set forth in claim 1, wherein said step of introducing impurities further comprises:
implanting ions of said one conductivity type without masking any regions of said substrate against implantation.

3. The method as set forth in claim 2, wherein said step of implanting further comprises:
implanting a dosage of ions in an amount having a range predetermined by the minimum overlap tolerance specification for said integrated circuit.

4. The method as set forth in claim 3, wherein said first conductivity type is n-type and said overlap tolerance is approximately 0.75 micron, and with lithography capable of approximately 0.7 micron layer-to-layer alignment accuracy and discrete bird's beak widths of 1.5 microns, said step of implanting further comprises:
implanting phosphorous ions in a dosage having a range of $5 \times 10^{13}$ to $1 \times 10^{14}$.

5. A maskless method of forming improved contact regions in shallow source and drain regions of one conductivity type in a CMOS integrated circuit structure substrate having source and drain regions of a first conductivity type formed in said substrate and source and drain regions of a second conductivity type constructed in well regions of said first conductivity type formed in said substrate and said integrated circuit further having contact apertures in one or more insulating layers formed over said source and drain regions, said method being characterized by:
(a) projecting a beam of ions of the same conductivity type as said shallow source and drain regions onto said structure; and
(b) limiting said beam of ions to a dosage having a range which deepens at least a portion of only said shallow source and drain regions of said one conductivity type without lowering the breakdown voltage of the source and drain regions of the opposite conductivity type.

6. The method as set forth in claim 5, wherein said dosage has a range which does not affect resistivity of said regions of said second conductivity type.

7. The process of claim 5 wherein said shallow source and drain regions in said CMOS structure comprise n-type conductivity regions formed in said substrate and said beam of ions projected onto said structure comprises a beam of phosphorus ions providing a dosage of from about $5 \times 10^{13}$ to about $1 \times 10^{14}$ ions/cm$^2$ to provide a breakdown voltage of 30+ volts for the n-channel devices formed from said initially shallow source and drain regions and a breakdown voltage of approximately $-25$ volts for p-channel devices formed from said source and drain regions of opposite conductivity.

* * * * *